United States Patent [19]
Cunningham et al.

[11] Patent Number: 5,834,792
[45] Date of Patent: Nov. 10, 1998

[54] ARTICLES COMPRISING DOPED SEMICONDUCTOR MATERIAL

[75] Inventors: John Edward Cunningham, Lincroft; Won-Tien Tsang, Holmdel, both of N.J.

[73] Assignee: Lucent Technologies Inc., Murray Hill, N.J.

[21] Appl. No.: 111,765

[22] Filed: Aug. 25, 1993

Related U.S. Application Data

[63] Continuation of Ser. No. 774,671, Oct. 11, 1991, abandoned.

[51] Int. Cl.$^6$ .................................................... H01L 29/15
[52] U.S. Cl. ................................ 257/17; 257/18; 257/22; 257/194
[58] Field of Search ................................ 257/17, 18, 22, 257/194

[56] References Cited

U.S. PATENT DOCUMENTS

| | | | |
|---|---|---|---|
| 4,163,237 | 7/1979 | Dingle et al. ............................. | 257/20 |
| 4,792,832 | 12/1988 | Baba et al. ................................. | 257/22 |

OTHER PUBLICATIONS

S. M. Sze, "Physics of Semiconductor Devices", second edition, A Wiley–Interscience Publication, p. 21.
"Electron Mobilities in Modulation–Doped Semiconductor Heterojunction Superlattices", by R. Dingle et al, *Applied Physics Letters* 33(7), Oct. 1, 1978, pp. 665–667.

*Primary Examiner*—Jerome Jackson
*Attorney, Agent, or Firm*—Eugen E. Pacher

[57] ABSTRACT

The disclosed novel doping method makes it possible to tailor the effective activation energy of a dopant species in semiconductor material. The method involves formation of very thin layers of δ-doped second semiconductor material in first semiconductor material, with the second material chosen to have a bandgap energy that differs from that of the first material. Exemplarily, in a Be-doped GaAs/AlGaAs structure according to the invention the effective activation energy of the dopant was measured to be about 4 meV, and in conventionally Be-doped GaAs it was measured to be about 19 meV. The invention can be advantageously used to dope III-V and II-VI semiconductors. In some cases it may make possible effective doping of a semiconductor for which prior art techniques are not satisfactory.

11 Claims, 3 Drawing Sheets

ARTICLES COMPRISING DOPED SEMICONDUCTOR MATERIAL

This application is a continuation of application Ser. No. 07/774,671, filed on Oct. 11, 1991 now abandoned.

FIELD OF THE INVENTION

This invention pertains to semiconductor devices and to semiconductor device manufacture. Preferred embodiments pertain to devices, and to the manufacture of devices, that comprise doped III-V or II-VI semiconductor material.

BACKGROUND OF THE INVENTION

Doped semiconductor materials are well known and are basic to semiconductor devices. It is also well known that a given dopant has an activation energy in a given semiconductor material. See, for instance, S. M. Sze, "Physics of Semiconductor Devices", 2nd edition, page 21, which lists the activation energies of various elements in Ge, Si, and GaAs.

The activation energy typically is fixed and cannot be changed under normal operating conditions. As a result, there is generally only a limited choice of dopants for a given semiconductor. If other constraints (e.g., solid solubility, solid state diffusion, and compatibility with device processing) are also taken into account there frequently are only one or two dopants that are suitable for a given semiconductor. In some semiconductors, such as the wide-gap II-VI materials, there can be a complete lack of one type of effective dopant.

In view of these limitations it would be highly desirable to have available a technique that offers the freedom to tailor the activation energy of a given dopant in a given semiconductor material. This application discloses such a technique.

SUMMARY OF THE INVENTION

Broadly speaking, the invention involves a novel approach to the doping of semiconductor materials that permits the tailoring of the activation energy of the dopant atoms and that makes possible, at least in some cases, attainment of useful doping levels in materials in which prior art methods have failed to produce such useful levels.

The invention can be embodied in an article that comprises a semiconductor region that contains dopant atoms. Exemplarily, the article is an electronic or opto-electronic semiconductor device, or an integrated assembly of such devices. The dopant-containing semiconductor region comprises at least one (typically a multiplicity) layer of a second semiconductor material that is epitaxial with, and contacted by, first semiconductor materials on both sides. Associated with each of the first and second materials are two band edge energies (valence and conduction band edge energies) and an activation energy for the dopant species. The second material is selected such that there exists a band edge offset in at least one of the two band edges, e.g., in the valence band edge if the dopant is an acceptor. In many cases it will be desirable for the second material to have a larger bandgap than the first, with the offset being mainly in the conduction band for donors, or in the valence band for acceptors.

Significantly, the above described multilayer structure is doped such that substantially all of the dopant atoms are contained in the second material layers. Preferably doping is in sheet-like form (δ-doped), with the dopant sheet substantially centered in the second material layer.

The thickness of the second material layer is such that the dopant atom wavefunction extends into the adjacent first material, typically at most about two Bohr radii ($r_B$) of the dopant atom in (bulk) second semiconductor material. This condition insures that, inter alia, there exists significant Coulomb attraction between a given dopant atom and its associated charge carrier.

The second material and the layer thickness are selected such that there is associated with the semiconductor region an effective activation energy $E_{Aeff}$ of the dopant atoms that differs from $E_{A1}$, the activation energy of the dopant atoms in bulk first semiconductor material.

DETAILED DESCRIPTION

Figure 1:
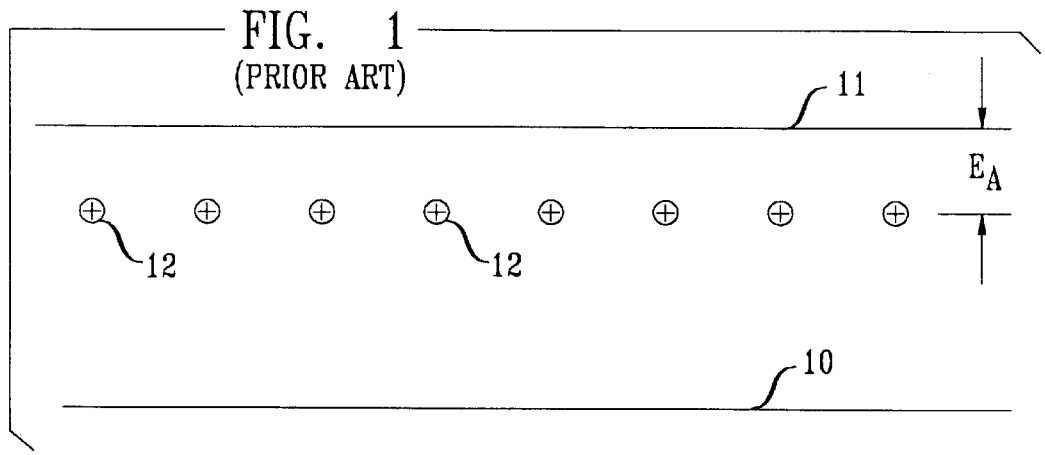
FIG. 1 schematically illustrates prior art doping.

FIG. 1 schematically depicts the relevant portion of the band diagram of a prior art n-doped semiconductor material, wherein lines 10 and 11 are, respectively, the valence and conduction band edges, and symbols 12 signify donor atoms having impurity energy levels within the bandgap of the semiconductor material, with an activation energy $E_A$.

Figure 2:
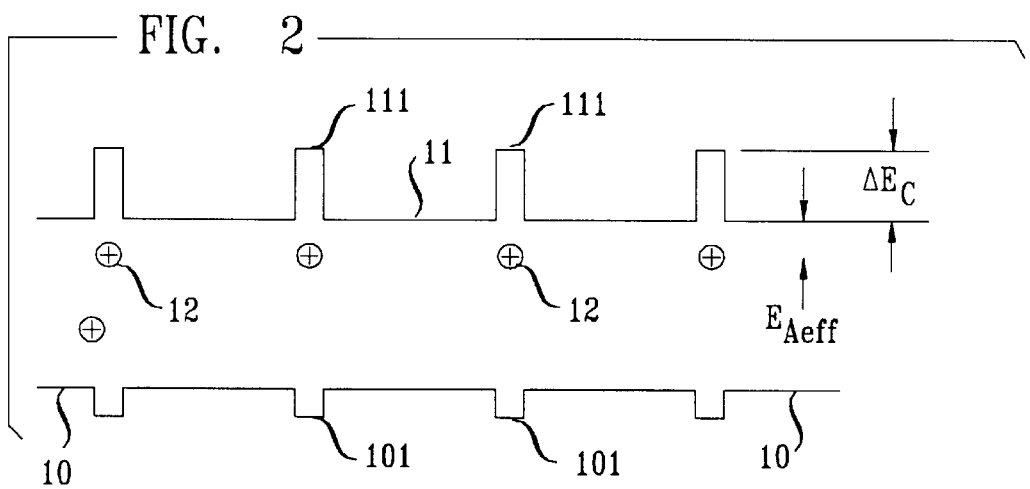
FIGS. 2–4 schematically depict exemplary embodiments of the inventive doping scheme.

FIG. 2 schematically illustrates a particular embodiment of the invention, wherein layers of a first semiconductor material (having valence and conduction band edges 10 and 11, respectively) alternate with thin layers of a second semiconductor material (having valence and conduction band edges 101 and 111, respectively). In this exemplary embodiment the second material has a larger bandgap than the first material, with a conduction band offset of $\Delta E_C$. The thin second semiconductor material layers are doped (preferably δ-doped) with donor atoms 12, who have an activation energy $E_{A2}$ in bulk second semiconductor material. In this case the effective activation energy of the donor atoms ($E_{Aeff}$) is, to a first approximation, approximately equal to $E_{A2} - \Delta E_C$. Thus, $E_{Aeff}$ can be tailored to be different from $E_A$.

Figure 3:
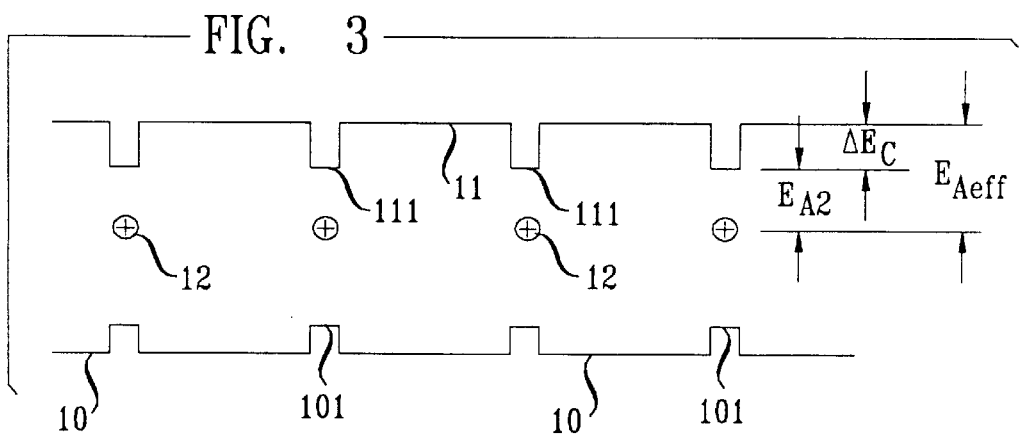

It will be appreciated that the inventive approach can result in a doped semiconductor region in which $E_{Aeff}<0$, i.e., wherein the dopant atoms are fully ionized at substantially all temperatures. It will also be appreciated that the inventive approach can be used to produce a semiconductor region wherein $E_{Aeff}>E_A$. In the case of n-type material this will typically involve choice of a second semiconductor material having a conduction band edge that is lower than that of the first semiconductor material. This situation is exemplarily illustrated in FIG. 3.

Figure 4:
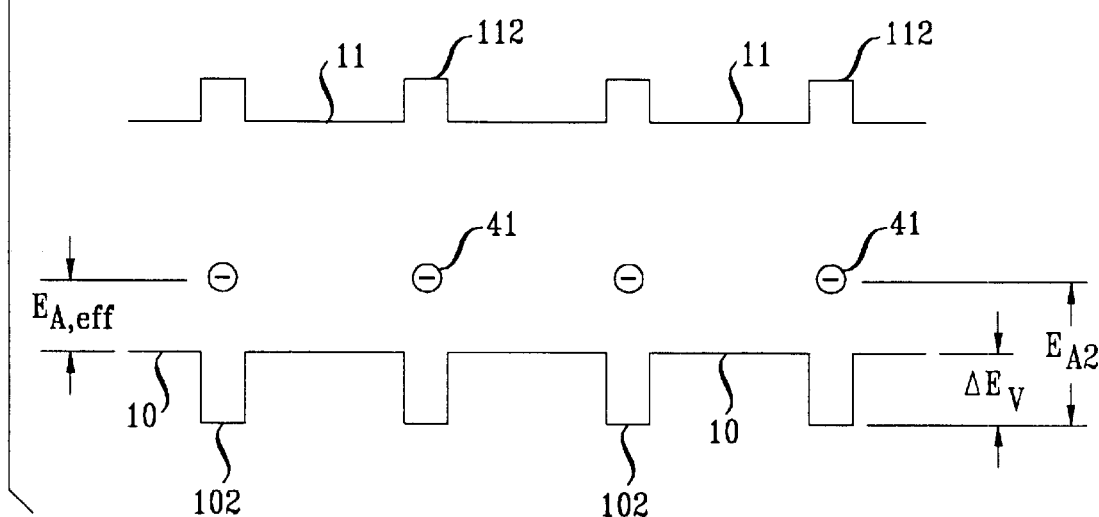

Those skilled in the art will also recognize that practice of the invention is not limited to n-type doping, and that the activation energy of acceptor atoms can be tailored in analogous fashion. This is illustrated in FIG. 4, wherein the second semiconductor material has valence and conduction band edges 102 and 112, respectively, and wherein acceptor atoms 41 are located in the thin second semiconductor material layers. The acceptor atoms have activation energy $E_{A2}$ in bulk second semiconductor material, the valence band offset (of the second semiconductor material relative to the first) is $\Delta E_V$, and the effective activation energy is, to a first approximation, $E_{A2} - \Delta E_V$. In FIG. 4, we consider 102 to correspond to a lower energy than 10.

It is known that the ionization energy of a dopant atom in a quantum well is somewhat modified, relative to its energy in the corresponding bulk semiconductor. Calculations show that the binding energy increases with decreasing well width but, rather than reaching a maximum at zero width, reaches a maximum at non-zero width. For clarity, this small effect is not considered in the discussion. Furthermore, FIGS. 2–4 do not show the known modification of the bandgap energy due to the presence of δ-charge in the quantum well.

Figure 5:
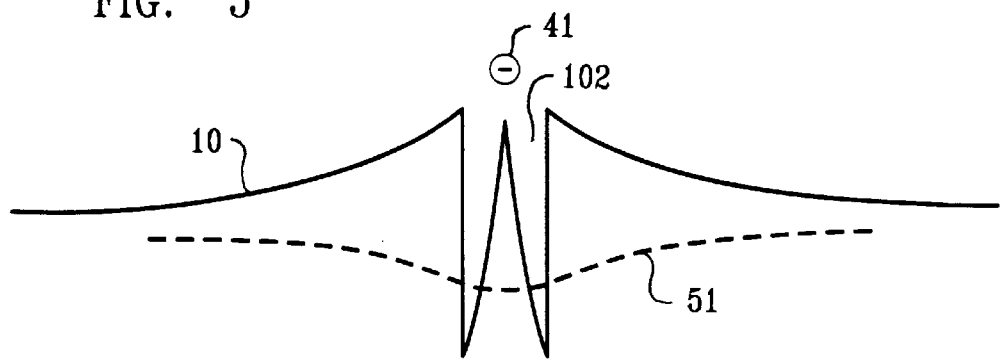
FIG. 5 schematically illustrates aspects of the inventive doping scheme, including the important feature that the relevant wavefunction extends beyond the doped second material quantum well.

A significant aspect of the invention is the choice of second material layer thickness. Broadly speaking, this thickness is chosen such that the wavefunction of the dopant atom extends beyond the second semiconductor material layer into the contacting first semiconductor material. This is schematically illustrated in FIG. 5, wherein numeral 51 refers to the wavefunction. As will be appreciated by those skilled in the art, in FIG. 5 band edge bending effects are indicated in the valence band edge of both the first and the second semiconductor material (10 and 102, respectively).

Associated with a dopant atom in a given semiconductor material is a length, conventionally referred-to as the Bohr radius $r_B$, which is a measure of the "size" of the dopant atom in the semiconductor material. As such, it is also a measure of the extent of the wavefunction. Thus, in articles according to the invention the second semiconductor material layer will typically be at most about $2r_B$ thick, frequently at most about 20 monolayers or even as little as 2 nm thick. It will be understood that the dopant atoms desirably are concentrated at or near the center of the second semiconductor material layer, i.e., the layer is symmetrically δ-doped. The Bohr radius of a given dopant element in a given semiconductor can be computed. For a hydrogen-like dopant it is equal to $(\epsilon_o \epsilon_r h^2)/(\pi \mu e^2)$ wherein $\epsilon_o$ is the permittivity constant, $\epsilon_r$ is the relative permittivity, h is Planck's constant, $\mu$ is the carrier effective mass, and e is the electronic charge. Typically, in semiconductors the Bohr radius is of order 10 nm.

Figure 6:
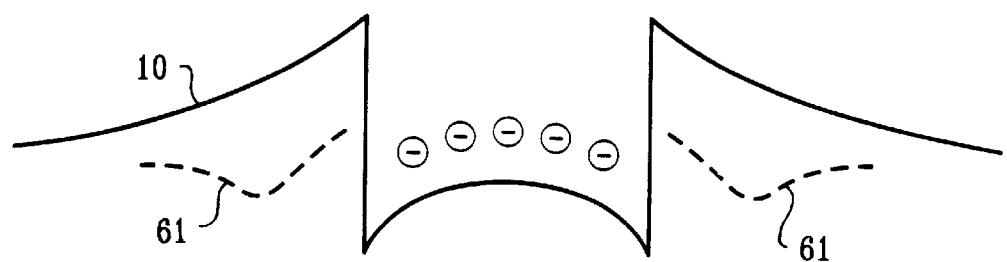
FIG. 6 schematically depicts aspects of prior art modulation doping, including the feature that the relevant wavefunctions do not substantially extend into the quantum well.

It will be appreciated that in doped semiconductor material according to the invention the quasi-free carriers still remain bound to their parent dopant atoms, but have reduced binding energy, and thus reduced activation energy. This is to be contrasted with the prior art doping scheme conventionally referred to as modulation doping, (see, for instance, R. Dingle et al., *Applied Physics Letters,* Vol. 33(7), 665 (1978) schematically illustrated in FIG. 6. In this case the second semiconductor material layer is substantially thicker than $2r_B$ and, typically, is substantially uniformly doped. The carriers are spatially removed from their parent dopant atoms and are no longer bound by Coulomb attraction to the parent atoms. Instead, the free carriers occupy energy eigenstates at the first/second semiconductor material interfaces, as indicated by wavefunctions 61.

Those skilled in the art will understand that the second semiconductor material layers are epitaxial with the contacting first semiconductor material. Since the thickness of the former material typically corresponds to only a few monolayers (and thus will typically be substantially less than the thickness $h_{epi}$ at which dislocation generation begins), the second semiconductor material need not have the same lattice parameter as the first semiconductor material. Instead, the second material can be selected to result in a strained layer, further increasing the opportunity to tailor $E_{Aeff}$ of the semiconductor region.

The equivalent 3-dimensional dopant concentration in a semiconductor region according to the invention is determined by the 2-dimensional (sheet) doping density and the periodicity of the second semiconductor material layers. However, there need not be one-to-one correspondence between the number of dopant atoms per unit volume and the density of free charge carriers. Since typically the second semiconductor material layers are much thinner than the first material layers, the heterostructure behaves substantially as if the dopant atoms were present in uniform first semiconductor material, but having activation energy $E_{Aeff}$ instead of $E_A$.

Exemplarily, we have grown a 1.5 $\mu$m thick semiconductor structure on a GaAs substrate. The structure comprises Be doped $Al_{0.3}Ga_{0.7}As$ layers (1.5 nm thick) alternating with 21 nm thick GaAs layers, and was grown by conventional gas source MBE using a relatively low growth temperature (~500° C.) to avoid undesired diffusion and segregation effects. The AlGaAs layers were δ-doped about ($2 \times 10^{10}$/ $cm^2$) at the center. A comparison structure that contained the same periodic layer structure but was uniformly doped with Be at the $10^{16}/cm^3$ level was also grown. Other growth techniques (e.g., CBE, MOCVD or MBE) can also be used in the practice of the invention.

Figure 7:
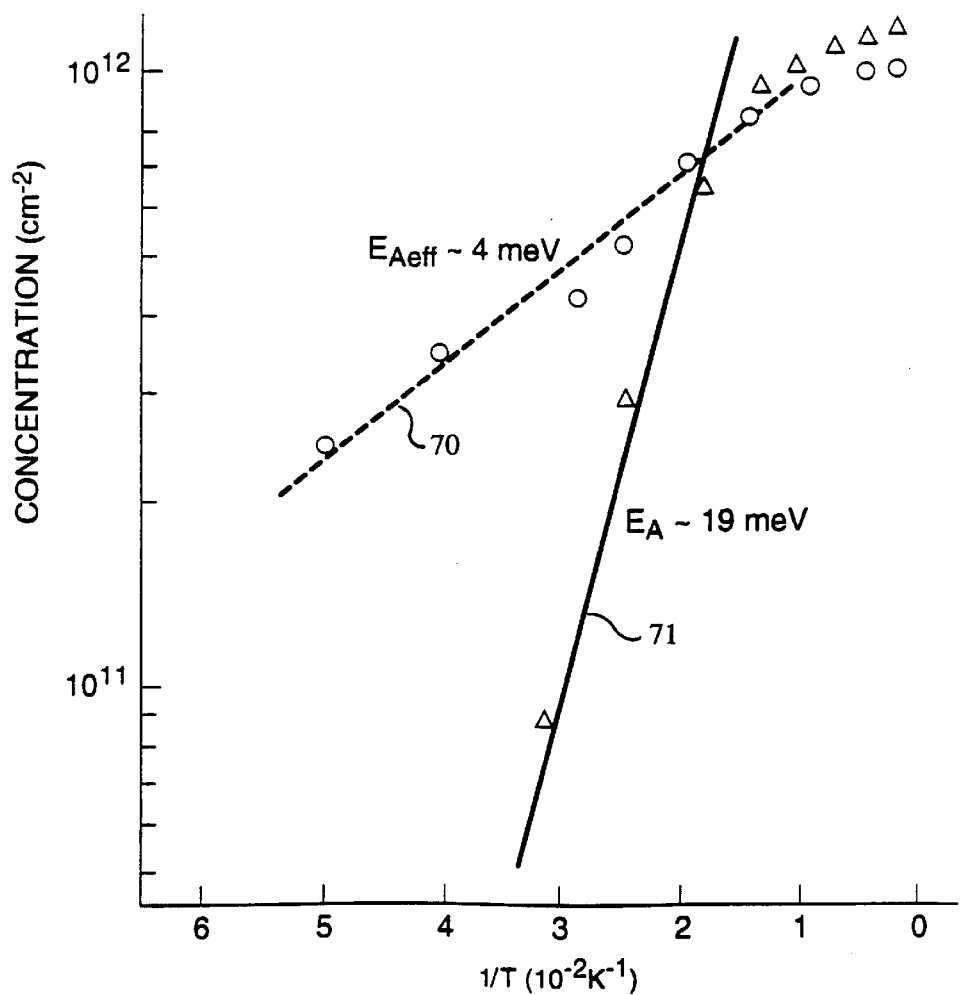
FIG. 7 shows data that illustrate the ability of the disclosed doping scheme to tailor the dopant activation energy.

We carried out Hall effect measurements on the above described structures. FIG. 7 shows the carrier concentration vs. reciprocal temperature, with lines 70 and 71 pertaining to the δ-doped and the uniformly doped structures, respectively. The measured data in both cases can be fit by an Arrhenius expression at low temperature. From the slopes of lines 70 and 71 it can be determined that $E_{Aeff}$ of the δ-doped structure is about 4 meV, and that the comparison structure exhibited an activation energy of about 19 meV.

Although the invention can be used to tailor the activation energy of dopants in an elemental semiconductor region (e.g., in a $Si/Ge_xSi_{1-x}$ strained layer structure), it is likely to be most advantageously used in conjunction with III-V, and especially II-VI, compound semiconductors.

Exemplary of the former is InP. It is known that it is difficult to obtain free hole concentrations much above $10^{18}/cm^3$ in InP. Although Zn as the p-type dopant has higher solubility in InP than Be, it undesirably also has higher diffusivity. Increased free hole concentrations in InP would be highly desirable for electronic and photonic applications. This is now attainable by means of $InP/In_xGa_{1-x}As$ ($0 \leq x \leq 0.2$) or $InP/In_xAl_{1-x}As$ ($0 \leq x \leq 0.6$) structures according to the invention. In these designations InP is the first semiconductor material. Not only does the inventive method offer the possibility of tailoring $E_{Aeff}$ to produce effective dopant ionization and hence more efficient doping, but Be shows essentially unlimited electrical solubility in the above recited ternary wide-gap semiconductors.

Se-based II-VI compound semiconductors are exemplary of II-VI semiconductor systems that can benefit from the invention. It is well known that up to now it has proven difficult to p-dope Se-based II-VI compounds. Consequently, visible light photonic devices in these materials have shown only marginal performance. Dopants such as N and As do provide limited p-activity in, e.g., ZnSe but also have large $E_A$ (typically >100 meV). Hence, at room temperature acceptor atoms typically are not ionized in ZnSe. Similar problems are found in $Cd_xZn_{1-x}Se$. The novel doping scheme of this application offers a solution to these problems, exemplarily by use of a ZnS-based wide-gap II-VI second semiconductor material. ZnS-based materials can provide substantial valence band offsets, resulting in more efficient acceptor ionization. Because of the, typically, relatively small value of $r_B$ in these II-V materials, very thin (e.g., 2 monolayers) second semiconductor material layers can be used in these structures.

Another exemplary II-V system which can benefit from the disclosed approach is ZnTe, which is known to be difficult to dope n-type by conventional techniques. In this system, n-type doping can exemplarily be achieved by use of ZnSe (and appropriate ZnSe-based materials) as the second semiconductor material.

Figure 8:
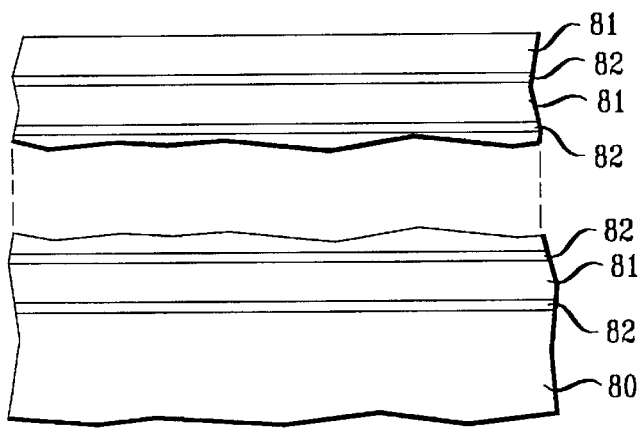
FIG. 8 depicts schematically a doped semiconductor region according to the invention.

FIG. 8 schematically depicts an exemplary semiconductor structure according to the invention, wherein 80 is a portion of a semiconductor body (optionally doped), layers 81 are undoped first semiconductor material (exemplarily the same semiconductor as 80), and layers 82 are thin δ-doped second semiconductor material. It will be appreciated that, if region 80 is of one conductivity type and layers 82 are doped with atoms associated with the other conductivity type, then the structure of FIG. 8 is a p-n junction. Provision of means for making electrical contacts to the structure (these means are not shown and are well known) would result in a diode, exemplarily a LED.

We claim:

1. An article that comprises a multilayer semiconductor structure comprising, in sequence, a first layer of thickness $t_1$ of a first semiconductor material, a second layer of thickness $t_2$ of a second semiconductor material, and a third layer of the first semiconductor material, with the first and third layers being essentially undoped, and the second layer comprising dopant atoms that provide charge carriers to said first and third layers, with the first semiconductor material differing in chemical composition from the second semiconductor material; associated with the first semiconductor material being a first and a second band edge energy and an activation energy $E_{A1}$ of said dopant atoms; associated with said second semiconductor material being a third and a fourth band edge energy, with said first, second, third and fourth band edge energies being such that there exists a band edge offset in at least one of the conduction or valence band of the semiconductor body; and associated with each dopant atom in the second layer being a wave function and a Bohr radius $r_B$;

characterized in that a) $t_2$ is at most $2r_B$, and the dopant atoms are located such that the wave function of any given dopant atom extends into at least one of said first and third layers, such that said charge carriers experience Coulomb attraction to said dopant atoms, and associated with said charge carriers is an effective activation energy $E_{Aeff}$; and b) $t_1$, $t_2$, and the first and second semiconductor materials are selected such that $E_{Aeff}$ is less than $E_{A1}$, and $t_1$ is much greater than $t_2$ such that the multilayer semiconductor structure behaves substantially as if the dopant atoms were present in uniform first semiconductor material.

2. The article of claim 1, wherein said dopant atoms are donor atoms, the first and third band edge energies are conduction band edge energies, and the conduction band edge energy of the second semiconductor material differs from that of the first semiconductor material.

3. The article of claim 2, wherein the conduction band edge energy of the second semiconductor material exceeds that of the first semiconductor material.

4. The article of claim 1, wherein said dopant atoms are acceptor atoms, the second and fourth band edge energies are valence band energies, and the valence band edge energy of the second semiconductor material differs from that of the first semiconductor material.

5. The article of claim 4, wherein the valence band edge energy of the second semiconductor material is lower than that of the first semiconductor material.

6. The article of claim 1, comprising a multiplicity of substantially identical second semiconductor material layers, with a layer of first semiconductor material of thickness $t_1$ between adjacent pairs of second semiconductor material.

7. The article of claim 6, wherein the thickness of the second semiconductor material layers is at most about 2 nm.

8. The article of claim 1, wherein the first semiconductor material is selected from the group consisting of III-V and the II-VI compound semiconductors.

9. The article of claim 8, wherein the first semiconductor material is selected from the group consisting of the Se-based and the Te-based II-VI compound semiconductors.

10. The article of claim 1, wherein the semiconductor region is at least a part of an electronic or opto-electronic device.

11. Article according to claim 7, wherein $t_1$ is about 21 nm.

* * * * *